(12) United States Patent
Beckenbaugh et al.

(10) Patent No.: US 7,725,870 B2
(45) Date of Patent: *May 25, 2010

(54) METHOD FOR RADIATION TOLERANCE BY IMPLANT WELL NOTCHING

(75) Inventors: Mark R. Beckenbaugh, Rochester, MN (US); AJ KleinOsowski, Austin, TX (US); Eric J. Lukes, Stewartville, MN (US)

(73) Assignee: International Business Machines Corporation, Armonk, NY (US)

( * ) Notice: Subject to any disclaimer, the term of this patent is extended or adjusted under 35 U.S.C. 154(b) by 317 days.

This patent is subject to a terminal disclaimer.

(21) Appl. No.: 11/838,286

(22) Filed: Aug. 14, 2007

(65) Prior Publication Data

US 2009/0045841 A1 Feb. 19, 2009

(51) Int. Cl.
*G06F 17/50* (2006.01)
*H03K 19/00* (2006.01)

(52) U.S. Cl. .................. 716/17; 326/45; 257/371; 257/E27.067

(58) Field of Classification Search .............. None
See application file for complete search history.

(56) References Cited

U.S. PATENT DOCUMENTS

| | | | |
|---|---|---|---|
| 4,745,084 A | 5/1988 | Rowson et al. | |
| 5,220,192 A | 6/1993 | Owens et al. | |
| 6,100,550 A * | 8/2000 | Hidaka | 257/210 |
| 6,177,691 B1 | 1/2001 | Iranmanesh et al. | |
| 6,177,709 B1 | 1/2001 | Iranmanesh | |
| 6,212,671 B1 | 4/2001 | Kanehira et al. | |
| 6,292,343 B1 | 9/2001 | Pequignot et al. | |
| 6,583,470 B1 | 6/2003 | Maki et al. | |
| 6,735,755 B2 | 5/2004 | Shau | |
| 2009/0045840 A1* | 2/2009 | Beckenbaugh et al. | 326/45 |
| 2009/0045841 A1 | 2/2009 | Beckenbaugh et al. | |

* cited by examiner

*Primary Examiner*—Leigh Marie Garbowski
(74) *Attorney, Agent, or Firm*—Libby Z. Handelsman; Jack V. Musgrove

(57) ABSTRACT

A logic book for a programmable device such as an application-specific integrated circuit (ASIC) achieves improved radiation tolerance by providing notches in an implant well between adjacent transistors and fills the notches with complementary well regions that act as a barrier to charge migration. For example, a row of n-type field effect transistors (NFETs) is located in a Pwell region, while a row of p-type transistors is located in an Nwell region with portions of the Nwell region extending between the NFETs. More complicated embodiments of the present invention include embedded well islands to provide barriers for adjacent transistors in both rows of the book.

20 Claims, 5 Drawing Sheets

METHOD FOR RADIATION TOLERANCE BY IMPLANT WELL NOTCHING

CROSS-REFERENCE TO RELATED APPLICATION

This application is related to U.S. patent application Ser. No. 11/838,273 filed on Aug. 14, 2007, which is hereby incorporated.

BACKGROUND OF THE INVENTION

1. Field of the Invention

The present invention generally relates to the fabrication and design of semiconductor chips and integrated circuits, and more particularly to a method of imparting radiation tolerance to a programmable logic device such as an application-specific integrated circuit (ASIC) having a design library which includes books of n-type and p-type semiconductor devices.

2. Description of the Related Art

Integrated circuits are used for a wide variety of electronic applications, from simple devices such as wristwatches to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of a circuit into a layout is called the physical design.

Due to the large number of components and the details required by the fabrication process, physical design of an integrated circuit is not practical without the aid of computers. As a result, most phases of physical design extensively use computer aided design (CAD) tools, and many phases have already been partially or fully automated. Automation of the physical design process has increased the level of integration, reduced turn around time and enhanced chip performance. However, full custom design and production of a circuit can still be very time-consuming and costly, so circuit designers have turned to a more flexible approach using programmable logic devices such as field programmable gate arrays (FPGAs) or application-specific integrated circuits (ASICs) that contain standardized logic cells. One example of an ASIC is shown in FIG. 1. ASIC 2 has a plurality of input pins and a plurality of output pins, and further includes a variety of interconnected functional blocks placed on a substrate that are derived from the design library, including input/output (I/O) blocks, a core or microprocessor, an arithmetic logic unit (ALU), a digital signal processor (DSP), random-access memory (RAM), firmware or read-only storage (ROS), proprietary circuit macros (IP), and programmable logic. The programmable logic may be provided in the form of books 4 which contain rows of various semiconductor devices such as transistors and diodes, or other circuit elements such as capacitors and resistors, and can be used to create combinational gates such as AND, OR, NAND, NOR, and XOR gates as well as inverters, latches and more complicated logic structures.

FIG. 2 illustrates a typical construction for transistor books. The transistor book 4a of FIG. 2 has a first (upper) row of p-type field effect transistors (PFETs) located within a region of complementary (n-type) doping 6 (an implant well) referred to as an Nwell, and a second (lower) row of n-type field effect transistors (NFETs) located within a region of complementary (p-type) doping 8 referred to as an Pwell. Nwell 6 and Pwell 8 may extend vertically beyond the boundary of book 4a into adjacent books. The logic is programmed by applying a metallization layer that makes appropriate interconnections with the nodes of desired devices in the books.

One problem with this book construction is that, since each PFET shares the common Nwell 6 and each NFET shares the common Pwell 8, a radiation strike in either of these wells can affect multiple devices in that row, increasing the likelihood of a soft error. For example, one NFET device may be used in a latch to hold the true value of a bit and another NFET device in the same book may be used to hold the complementary (inverse) value of the bit, and a single radiation event can upset both NFET devices, causing the latch to change its logical state. The radiation may be, e.g., an alpha particle strike emitted from packaging materials or neutrons originating from cosmic radiation. The soft-error rate (SER) of a data processing system can exceed the combined failure rate of all hard-reliability mechanisms (gate oxide breakdown, electromigration, etc.). Radiation tolerance has thus become a necessity for meeting robustness targets in advanced systems. All storage elements (random-access memory, latches, etc.) are highly susceptible to soft-error induced failures, but memory arrays are usually protected by error-correction codes (ECCs) while latches are usually not so protected. Soft errors in latches are accordingly the major contributors to overall system SER.

Information stored in latches may include control, status or mode bits. For example, a data processing system might provide different mode configurations for clock control logic, and clock control latches can account for a significant portion of a microprocessor latch count. These clock buffer modes are set at system power-on and often must maintain their logical value for days or months to ensure proper performance of the local logic circuits. However, the values can be upset during operation due to soft errors. An upset may be correctable by scanning in a new value, but systems may only allow input scanning in a limited manner such as at power-on, meaning that the system must be restarted if a clock control latch becomes incorrectly set. These reliability problems are particularly troublesome for harsher operating environments, such as aerospace systems where there is increased radiation (high-altitude or orbital space).

For transistor book constructions such as those shown in FIG. 2, it is impossible to isolate wells in a book for radiation tolerance due to vertical well sharing in automated ASIC methodology. Consequently, the only effective way to achieve superior radiation tolerance is by full custom placement, i.e., breaking up logic books into individual gates, which significantly increases the time and cost for design and production of the circuit. It would, therefore, be desirable to devise an improved ASIC book design which could provide the advantages associated with programmable structures but offer better isolation of localized semiconductor devices that might otherwise be affected by a radiation strike. It would be further advantageous if the book design could be implemented in a variety of relative sizes and work within existing ASIC methodologies.

SUMMARY OF THE INVENTION

It is therefore one object of the present invention to provide an improved logic structure for a programmable device such as an ASIC.

It is another object of the present invention to provide such a logic structure having increased radiation tolerance.

It is yet another object of the present invention to provide a method of using an ASIC transistor book to enhance radiation tolerance.

The foregoing objects are achieved in a logic book for an ASIC, generally comprising a first row of first semiconductor devices having a first doping type and sharing a first complementary well region, and a second row of second semiconductor devices having a second doping type and sharing a second complementary well region adjacent to the first complementary well region wherein the second complementary well region includes one or more portions which extend between at least some of the first semiconductor devices. The logic book may be a transistor book wherein the first semiconductor devices are transistors having the first doping type, and the second semiconductor devices are transistors having the second doping type. In one embodiment, the first complementary well region is a Pwell, the first semiconductor devices are n-type devices sharing the Pwell, the second complementary well region is an Nwell, and the second semiconductor devices are p-type devices sharing the Nwell. In an alternative embodiment the first complementary well region is a Nwell, the first semiconductor devices are p-type devices sharing the Nwell, the second complementary well region is an Pwell, and the second semiconductor devices are n-type devices sharing the Pwell. The extensions act as a physical barrier against charge migration between adjacent transistors after an ionizing radiation event, so the circuit structure is much less likely to suffer multiple upsets from a single radiation strike. More complicated embodiments of the present invention include additional well regions (islands) which have the doping type of the first complementary well region and extend between at least some of the second semiconductor devices.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
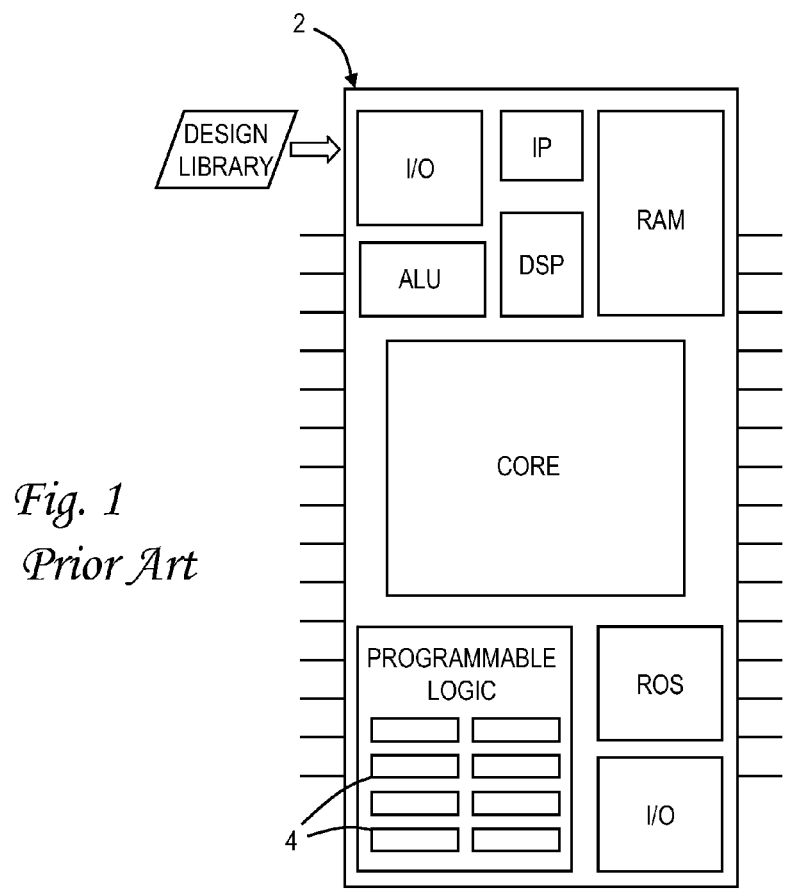
FIG. 1 is a high-level block diagram of a conventional application-specific integrated circuit (ASIC) which has various functional blocks and programmable logic that are derived from an ASIC design library.
Figure 2:
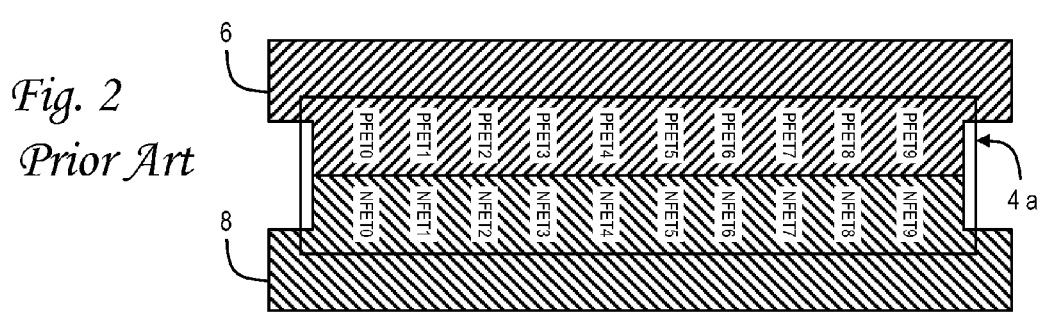
FIG. 2 is a plan view of a conventional ASIC transistor book design wherein a row of p-type devices are placed within an Nwell region and a row of n-type devices are placed within an Pwell region.
Figure 3:
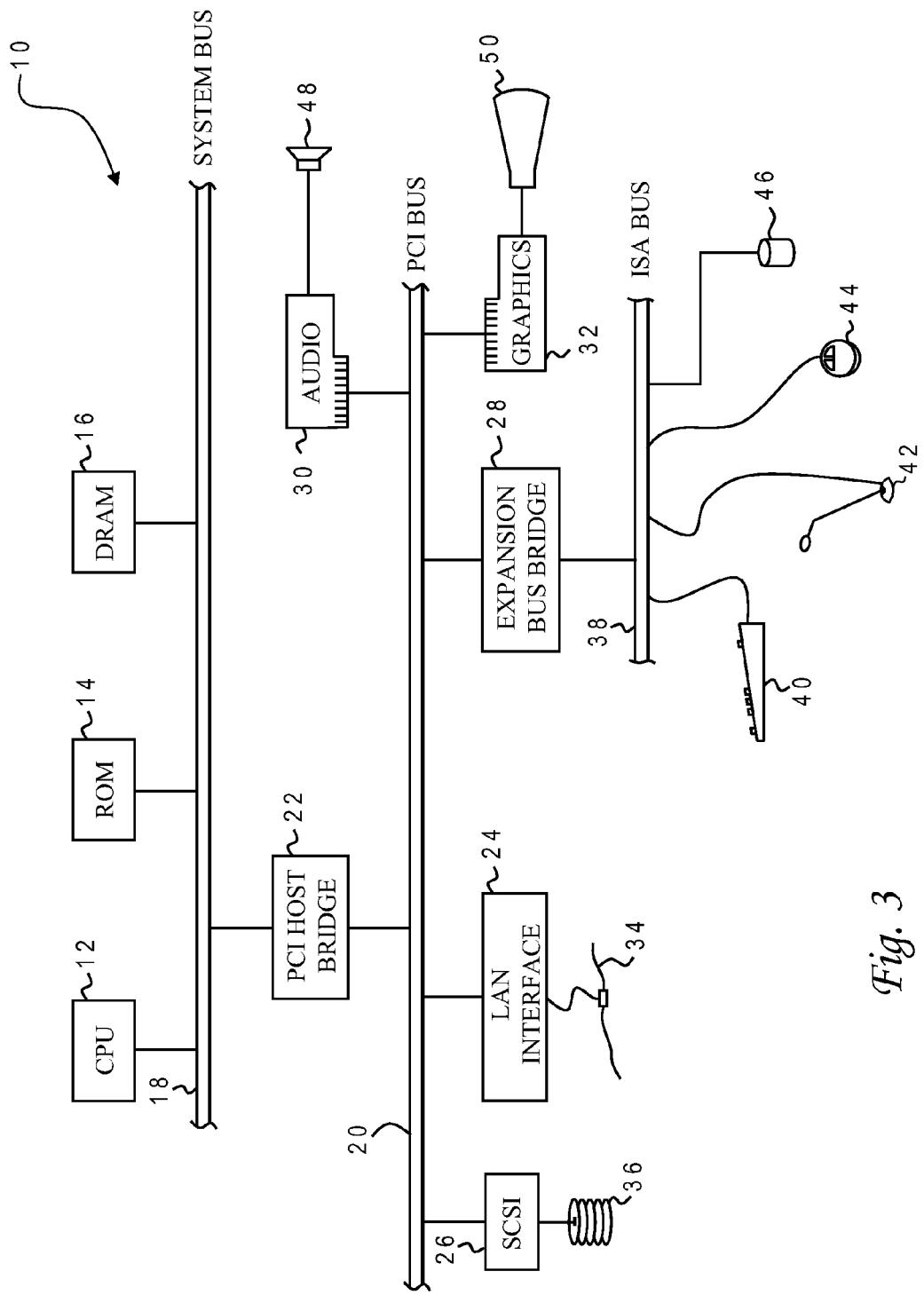
FIG. 3 is a block diagram of a computer system programmed to carry out computer-aided design of an integrated circuit in accordance with one implementation of the present invention.

With reference now to the figures, and in particular with reference to FIG. 3, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces. PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including a program which embodies the present invention as an application-specific integrated circuit (ASIC) design library, as well as any resultant data (circuit layouts) to be stored for later processing. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the ASIC design library embodying the present invention on disk drive 36, those skilled in the art will appreciate that the invention can be embodied in a program product utilizing other computer-readable media.

Computer system 10 carries out program instructions for the design of a programmable device such as an ASIC using novel transistor book designs adapted for improved radiation tolerance as explained below. These transistor books are selectively placed in the ASIC layout along with other functional circuit blocks. Accordingly, a program embodying the invention may include conventional aspects of various EDA tools used in ASIC design, and these details will become apparent to those skilled in the art upon reference to this disclosure.

Figure 4A:
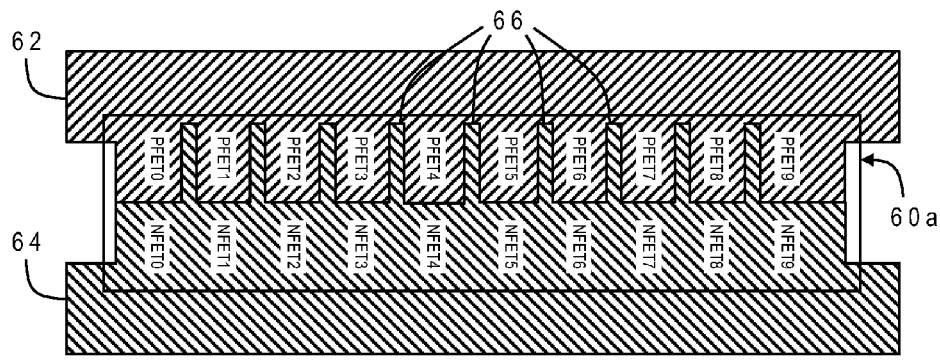
FIGS. 4A and 4B are plan views of two ASIC transistor book designs constructed in accordance with basic embodiments of the present invention wherein one of the implant wells has regions which extend into the other implant well.
Figure 4B:
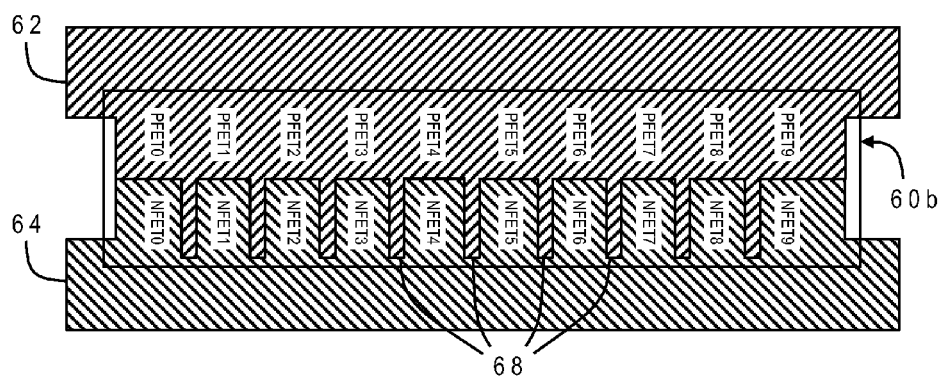

Referring now to FIGS. 4A and 4B, two basic embodiments are shown of an ASIC transistor book having implant well notching in accordance with the present invention. In FIG. 4A, transistor book 60a is comprised of two stacked, parallel rows of field-effect transistors (FETs), including an upper row of p-type FETs (PFETs) and a lower row of n-type FETs (NFETs). The PFETs are located within a region of complementary (n-type) doping 62 (Nwell), and the NFETs are located within a region of complementary (p-type) doping 64 (Pwell). Nwell 62 has notches formed therein between adjacent PFETs, and Pwell 64 has portions 66 which extend into these notches, i.e., interleaved between successive PFETs. The embodiment of book 60a is useful when two or more PFETs in the same book are desired for a circuit structure that the designer identifies as critical for radiation tolerance purposes. The intervening Pwell extensions 66 act as a physical barrier against charge migration between adjacent PFETs after an ionizing radiation event, so the circuit structure is much less likely to suffer multiple upsets from a single radiation strike.

An alternative embodiment is shown in FIG. 4B in which transistor book 60b has the same rows of PFETs and NFETs but Pwell 64 is notched and Nwell 62 has extensions 68 filling the notches, interposed between adjacent NFETs. The embodiment of book 60b is useful when two or more NFETs in the same book are desired for a circuit structure that is deemed critical for radiation tolerance purposes. The intervening Nwell extensions similarly inhibit charge migration after an ionizing radiation event. If a designer is able to choose between using NFETs or PFETs for a particular circuit structure, then transistor book 60b is deemed preferable since NFETs are generally more sensitive to radiation.

Figure 6:
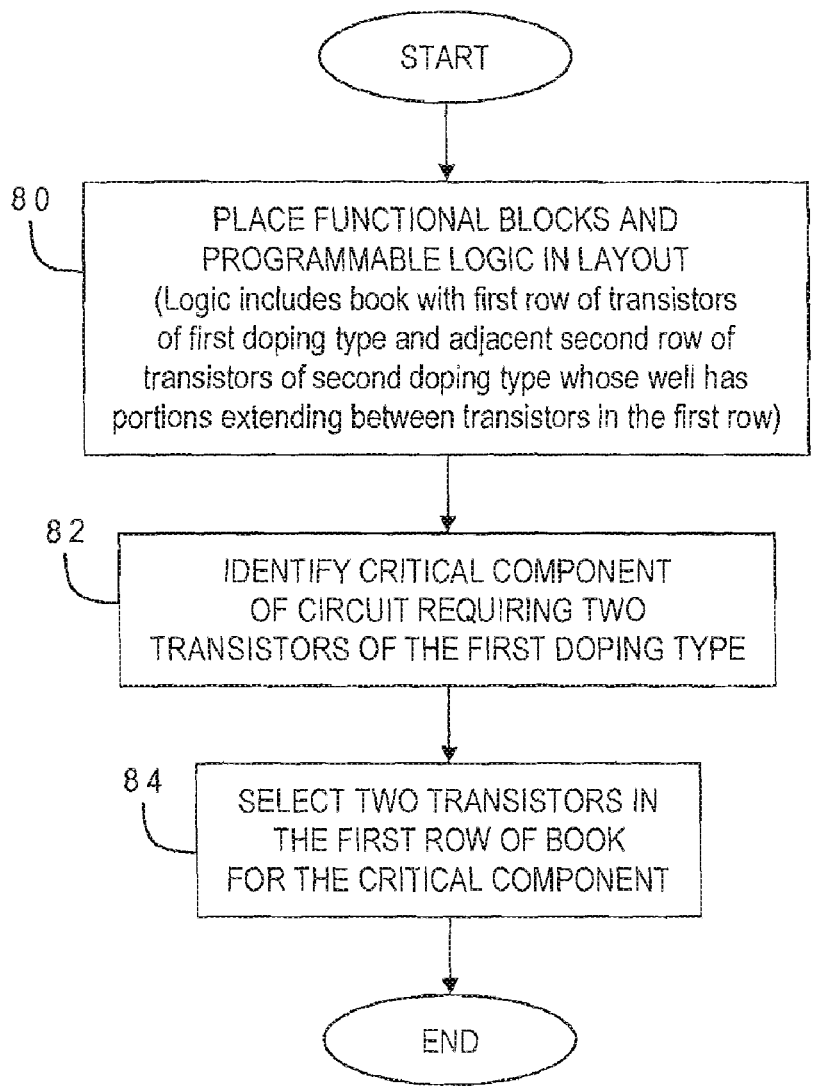
FIG. 6 is a chart illustrating the logical flow for placing a transistor logic book and selecting critical transistors in accordance with one implementation of the present invention.

With further reference to FIG. 6, templates for both of these books may be provided in a single ASIC design library. The functional blocks and programmable logic are placed in the layout according to the foregoing description (80). If a critical component is identified that requires at least two transistors of the same doping type in the same logic book (82), the designer can select the appropriate book having notches/extensions between transistors of that doping type so that two transistors from the same row may be used (84). While each of these embodiments has PFETs in the upper row and NFETs in the lower row, those skilled in the art will appreciate that mirror image embodiments may also be provided with NFETs in the upper row and PFETs in the lower row. The logic book may also have more than two rows of transistors, with implant well notching in more than one row.

The particular dimensions of the notches and extensions may vary considerably depending on the desired hardening and the specific semiconductor technology employed. The width of extensions 66, 68 should generally be as large as possible subject to area requirements and good design practices in order to maximize the barrier effect. In an exemplary embodiment with contemporary CMOS device technology the notches/extensions are about 0.3 µm wide. Extensions 66, 68 do not necessarily reach to the boundary of the logic book but preferably at least extend past the drain/source diffusion nodes of the adjacent FETs. While the drawings illustrate ten FETs in a row, this number is merely exemplary and the logic book could contain more or less transistors. The drawings also show extensions at regular intervals and between each adjacent pair of FETs, but the locations of the extensions could adjusted or some extensions omitted for example if an area is constrained by other cells or wiring. The doping level of the wells may further vary according to the application; in the preferred embodiments they are heavily doped, i.e., P+ or N+.

Figure 5A:
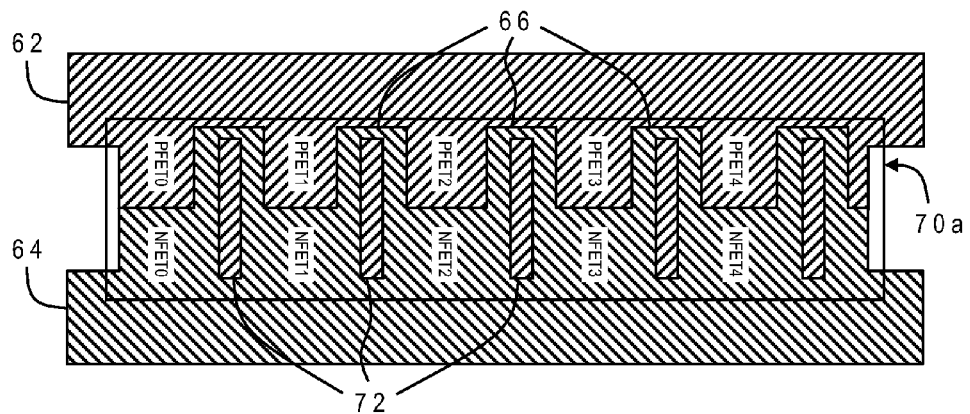
FIGS. 5A and 5B are plan views of two ASIC transistor book designs constructed in accordance with more complicated embodiments of the present invention wherein additional isolated island of wells are placed in the complementary well.
Figure 5B:
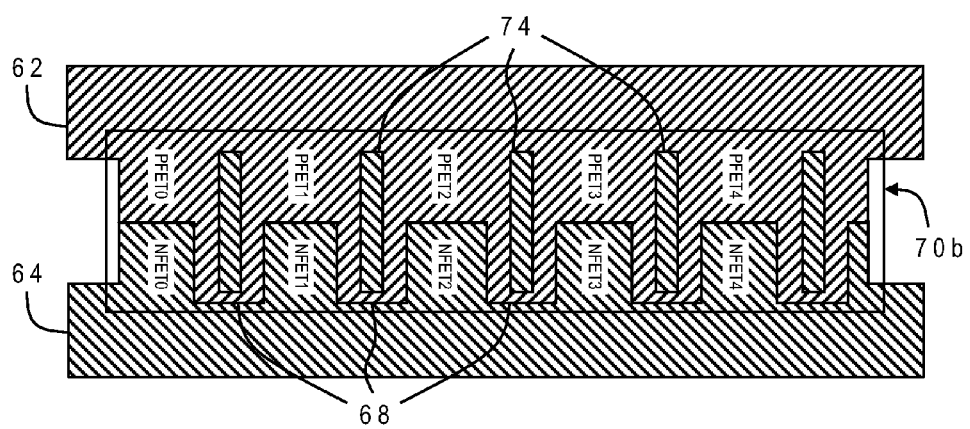

Transistor books having lower density but increased radiation tolerance can be constructed in a similar manner as illustrated by the examples shown in FIGS. 5A and 5B. In FIG. 5A, transistor book 70a again has an upper row of PFETs located in an Nwell 62, a lower row of NFETs located in a Pwell 64, and Pwell extensions 66 located in between adjacent PFETs, but Pwell extensions 66 are wider and elongate Nwell islands 72 are embedded in Pwell 64, formed along the centerline of the extensions. In this embodiment, Nwell islands 72 are isolated regions having no boundary that is contiguous with Nwell 62, i.e., they are completely surrounded by Pwell 64, but in an alternative design the upper ends of Nwell islands 72 could be extended to the boundary of Nwell 62. The lower ends of Nwell islands 72 extend between adjacent NFETs. Accordingly, this embodiment provides radiation tolerance for both the PFETs and the NFETs although there are fewer transistors given the same area. FIG. 5B illustrates the complementary design of transistor book 70b in which Nwell extensions 68 are interposed between adjacent NFETs and Pwell islands 74 are located within extensions 68 and are interposed between adjacent PFETs. An ASIC design library of the present invention may accordingly include templates for a variety of books having different implementations of well notching. The designer then has greater flexibility in selecting devices in isolated wells for critical components of any complexity.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been disclosed in the context of a transistor book, it is applicable to other book components which may share an Nwell or Pwell, such as diodes.

It is therefore contemplated that such modifications can be made without departing from the spirit or scope of the present invention as defined in the appended claims.

What is claimed is:

1. A logic book for a programmable device, comprising:
    a first row of first semiconductor devices having a first doping type and sharing first complementary well region with notches formed in said first complementary well region between at least some of said first semiconductor devices; and
    a second row of second semiconductor devices having a second doping type and sharing a second complementary well region adjacent to said first complementary well region, wherein said second complementary well region includes one or more portions which extend into said notches between at least some of said first semiconductor devices.

2. The logic book of claim 1 wherein said first semiconductor devices are first transistors having the first doping type, and said second semiconductor devices are second transistors having the second doping type.

3. The logic book of claim 1 wherein:
    said first complementary well region is a Pwell;
    said first semiconductor devices are n-type devices sharing said Pwell;
    said second complementary well region is an Nwell; and
    said second semiconductor devices are p-type devices sharing said Nwell.

4. The logic book of claim 1 wherein:
    said first complementary well region is a Nwell;
    said first semiconductor devices are p-type devices sharing said Nwell;
    said second complementary well region is an Pwell; and
    said second semiconductor devices are n-type devices sharing said Pwell.

5. The logic book of claim 1 further comprising one or more island regions embedded in said second complementary well region wherein said island regions have a doping type of said first complementary well region and extend between at least some of said second semiconductor devices.

6. An application-specific integrated circuit comprising:
    a substrate;
    a plurality of functional circuit blocks formed on said substrate; and
    programmable logic formed on said substrate which includes one or more transistor books having a first row of first transistors with a first doping type which share a first complementary well and notches formed in said first complementary well between at least some of said first transistors, and a second row of second transistors with a second doping type which share a second complementary well adjacent to said first complementary well, wherein said second complementary well includes one or more portions which extend into said notches between at least some of said first transistors.

7. The application-specific integrated circuit of claim 6 wherein:
    said first transistors are n-type field-effect transistors;
    said first complementary well is a Pwell;
    said second transistors are p-type field-effect transistors; and
    said second complementary well is an Nwell.

8. The application-specific integrated circuit of claim 7 further comprising one or more Pwell islands embedded in said Nwell wherein said Pwell islands extend between at least some of said p-type field-effect transistors.

9. The application-specific integrated circuit of claim 6 wherein:
    said first transistors are p-type field-effect transistors;
    said first complementary well is an Nwell;
    said second transistors are n-type field-effect transistors; and
    said second complementary well is a Pwell.

10. The application-specific integrated circuit of claim 9 further comprising one or more Nwell islands embedded in said Pwell wherein said Nwell islands extend between at least some of said n-type field-effect transistors.

11. A design library comprising:
    a computer-readable medium; and
    program instructions residing in said medium for deriving a layout of an application-specific integrated circuit by selectively placing a plurality of functional blocks and programmable logic, the programmable logic including a template for a transistor book having a first row of first transistors with a first doping type which share a first complementary well with notches formed in the first complementary well between at least some of the first transistors and a second row of second transistors with a second doping type which share a second complementary well adjacent to the first complementary well, wherein the second complementary well includes one or more portions which extend into the notches between at least some of the first transistors.

12. The design library of claim 11 wherein:
    the first transistors are n-type field-effect transistors;
    the first complementary well is a Pwell;
    the second transistors are p-type field-effect transistors; and
    the second complementary well is an Nwell.

13. The design library of claim 12 wherein the transistor book template further comprises one or more Pwell islands embedded in the Nwell wherein the Pwell islands extend between at least some of the p-type field-effect transistors.

14. The design library of claim 11 wherein:
    the first transistors are p-type field-effect transistors;
    the first complementary well is an Nwell;
    the second transistors are n-type field-effect transistors; and
    the second complementary well is a Pwell.

15. The design library of claim 14 wherein the transistor book template further comprises one or more Nwell islands embedded in the Pwell wherein the Nwell islands extend between at least some of the n-type field-effect transistors.

16. A computer-implemented method of designing an application-specific integrated circuit, comprising:
    placing a plurality of functional blocks and programmable logic in a layout by executing first program instructions in a computer system, the programmable logic including one or more transistor books having a first row of first transistors with a first doping type which share a first complementary well with notches formed in the first complementary well between at least some of the first transistors and a second row of second transistors with a second doping type which share a second complementary well adjacent to the first complementary well, wherein the second complementary well includes one or more portions which extend into the notches between at least some of the first transistors;
    identifying a component of the application-specific integrated circuit for which radiation tolerance is desired and which requires at least two transistors of the first doping type by executing second program instructions in the computer system responsive to designer selection; and selecting for the required transistors two of the first transistors in the transistor book by executing third program instructions in the computer system.

17. The method of claim 16 wherein:
the first transistors are n-type field-effect transistors;
the first complementary well is a Pwell;
the second transistors are p-type field-effect transistors; and
the second complementary well is an Nwell.

18. The method of claim 17 wherein the transistor book further comprises one or more Pwell islands embedded in the Nwell wherein the Pwell islands extend between at least some of the p-type field-effect transistors.

19. The method of claim 16 wherein:
the first transistors are p-type field-effect transistors;
the first complementary well is an Nwells;
the second transistors are n-type field-effect transistors; and
the second complementary well is a Pwells.

20. The method of claim 19 wherein the transistor book further comprises one or more Nwell islands embedded in the Pwell wherein the Nwell islands extend between at least some of the n-type field-effect transistors.

* * * * *